United States Patent [19]

Nordin

[11] Patent Number: 5,143,738
[45] Date of Patent: Sep. 1, 1992

[54] COMPUTERIZED FOOD PRODUCT EXTRUSION MACHINE AND METHOD

[75] Inventor: Ronnie Nordin, Beloit, Wis.

[73] Assignee: American Extrusion International, Inc., Boca Raton, Fla.

[21] Appl. No.: 667,469

[22] Filed: Mar. 11, 1991

[30] Foreign Application Priority Data

Feb. 9, 1990 [JP] Japan .................... 2-028372

[51] Int. Cl.⁵ .................... A23L 1/00; B02C 25/00
[52] U.S. Cl. .................... 426/231; 99/487;
99/516; 99/536; 99/323.4; 426/233; 426/448;
426/457
[58] Field of Search .............. 426/231, 233, 448, 457;
99/487, 516, 536, 323.4, 323.7

[56] References Cited

U.S. PATENT DOCUMENTS

| | | | |
|---|---|---|---|
| 2,295,868 | 4/1939 | Schwebke et al. | 426/448 |
| 2,350,643 | 6/1944 | Schwebke et al. | 99/323.4 |
| 4,847,103 | 7/1989 | Saito et al. | 426/448 |
| 4,994,286 | 2/1991 | Greer | 426/231 |

*Primary Examiner*—George Yeung
*Attorney, Agent, or Firm*—Hill, Van Santen, Steadman & Simpson

[57] ABSTRACT

A programmable controller controlled machine for extruding cellular food product between a rotory surface and a stationary surface, wherein the rotory surface is controllably repositioned between four axial positions relative to the stationary surface to obtain optimal product formation. Control is exerted over operating parameters in accordance with predetermined scales/ratios, at least some which can be adjusted during operation.

27 Claims, 5 Drawing Sheets

COMPUTERIZED FOOD PRODUCT EXTRUSION MACHINE AND METHOD

BACKGROUND OF THE INVENTION

The present invention generally relates to machines for extruding food products from, e.g., corn meal. More specifically, the invention relates to machines for extruding food products as described in U.S. Pat. Nos. 2,295,868 and 2,350,643.

In U.S. Pat. Nos. 2,295,868 and 2,350,643, both of which are incorporated herein by reference, there is described a machine and process for preparing extruded food products wherein raw material such as corn meal is reduced to a cooked fluid under considerable pressure, the food being left more or less tenacious and containing innumerable infinitesimal particles of water or vapor. The machine is designed to be self-heated by friction between particles of food matter and between the particles and surfaces of contacting metal in a manner such that pressure is progressively built-up during the heating period.

Uncooked raw material having a predetermined moisture content is processed into a somewhat viscous liquid having a temperature that is high enough to cook the material and to cause the water particles to evaporate at atmospheric pressure. However, because the material is under pressure, the water does not evaporate within the machine.

To provide the raw material with moisture, it is humidified, then broken down and cooked under pressure, as described above. During cooking, it is agitated to a point where it takes the form of a fluid but having sufficient viscosity to expand into a cellular structure when the pressure is released.

To accomplish the foregoing, after the material is cooked and liquefied, the material is extruded between two very closely spaced annular smooth surfaces, one of which turns at a relatively high speed, a rotor, the other of which is stationary, a stator, thereby to cause the material to whirl as it is extruded between these surfaces into atmospheric pressure. The expansion of pent up vapor and release steam forms cells in the extruded material thereby to form a cellular structure. The cellular structure is exuded from the machine in the form of a stream.

This machine has been produced and used in the United States for many years, as these patents issued in 1939. The basic design has remained relatively unchanged since then.

In the operation of the machine described above, the grain is manually humidified and then manually fed into the extruder. An operator then manually sets the gap between the rotor and stator, starts the drive motors, and after a preheat period, resets the gap until the resultant product appears to be at the proper density and appearance. This procedure is not exact, since there are no measuring devices on the machine to show this information. Therefore, start-up and operation of such machines varies from time-to-time and operator-to-operator.

SUMMARY OF THE INVENTION

The present invention provides an improved machine for extruding food products of the type described in the above-discussed prior art. More specifically, the invention provides an improved system for controlling humidification of the raw material and an improved system for controlling the spacing between the rotor and stator surfaces between which the food material si extruded.

Further, the invention provides a machine capable of exact start-up and the production of consistent food product each time the machine is started.

Additionally, the invention provides a machine that affords more control to an operator to make exact changes to a production line.

To these ends, in an embodiment, the invention provides a food extruder of the type wherein a food product is heated by friction between the food particles and then extruded between a rotor and a stator, comprising microprocessor control over the positioning of the rotor relative to the status such that during start-up the relative position of the rotor is varied in view of the status of various conditions sensed by sensors, and a chronological sequence of events, the timing of the chronological events being predetermined, and the relative positions of the rotor being predetermined.

In an embodiment, the invention provides that the rotor, during start-up, is automatically sequentially positioned in four axial positions relative to the stator, this providing for consistent start-up and product.

In an embodiment, the invention provides that the control system provides for reconfiguration of operating parameters so that processing can be varied as needed.

In an embodiment, the invention provides that food material is humidified prior to heating under the control of a moisture control system wherein liquid is added via a plurality of separate conduits, each conduit accommodating a different flow rate of liquid.

In an embodiment, the invention provides that the moisture control system accommodates incrementally selectable liquid flow rates.

These and other functions of the invention will become clearer below with reference to the Detailed Description of the Presently Preferred Embodiment and accompanying drawings.

DETAILED DESCRIPTION OF THE DRAWINGS

DETAILED DESCRIPTION OF THE PRESENTLY PREFERRED EMBODIMENTS

In the present invention, the basic design of the preferred food extruder is the same as that described in U.S. Pat. Nos. 2,295,868 and 2,350,643, the disclosures of which have been incorporated by reference. The improvements thereover are generally concentrated in the control system for such a food extruder.

As set forth above, the invention affords an operator the ability to establish exact start-up parameters and to produce consistent product each time the food extruder is started. To this end, in the presently preferred embodiment, there is provided a control system utilizing a microprocessor to control start-up, running, and shut down thereof, and to afford adjustment of parameters. The microprocessor then preferably is used as a multitasking process controller to control motor and motion functions. This control system will be discussed below.

Another microprocessor preferably controls the humidification of, i.e., addition of moisture to, the raw food material, such as corn meal.

Figure 1:
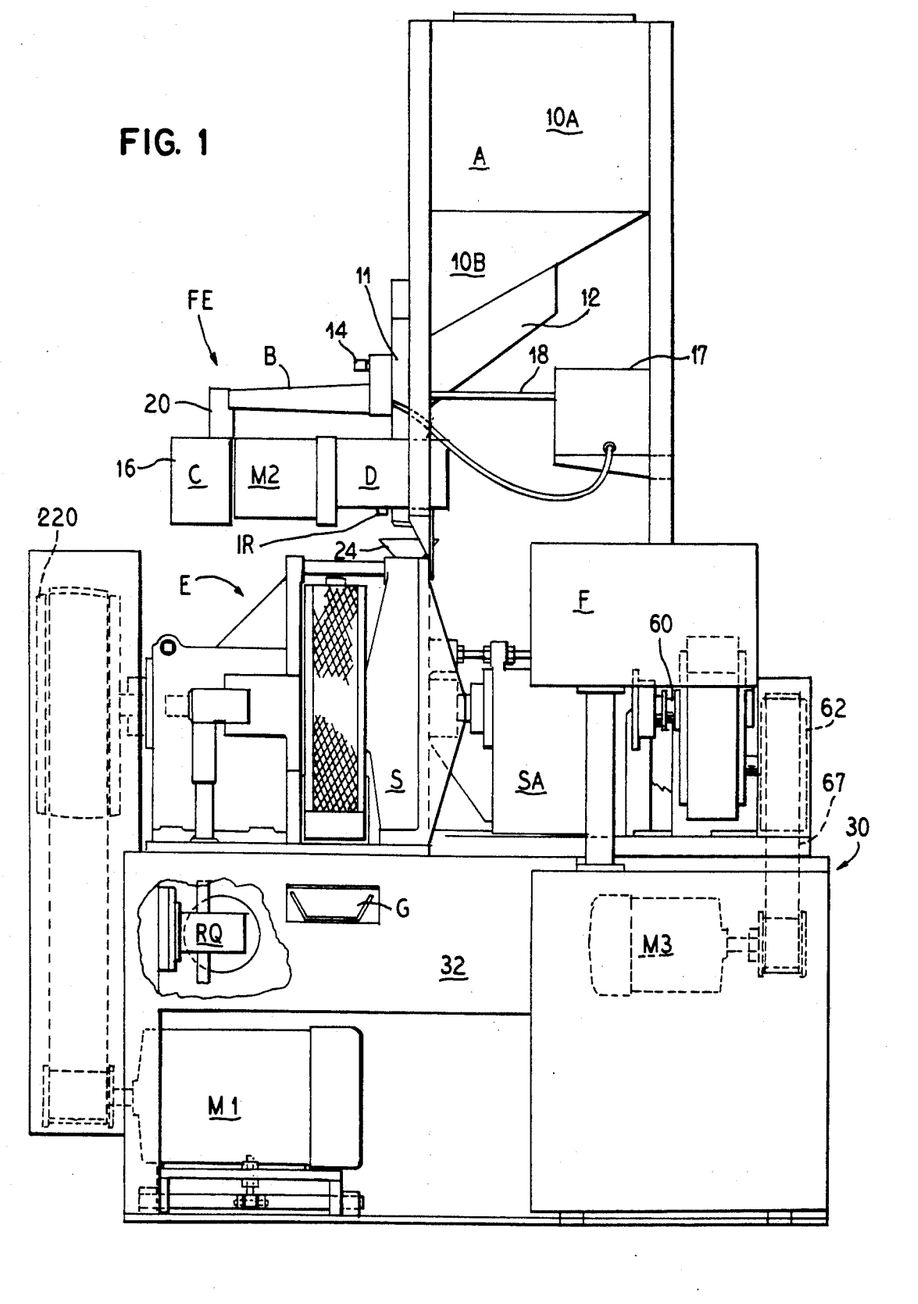
FIG. 1 is an elevational view, with portions broken away, of a food extruded used for producing cellular food product.
Figure 2:
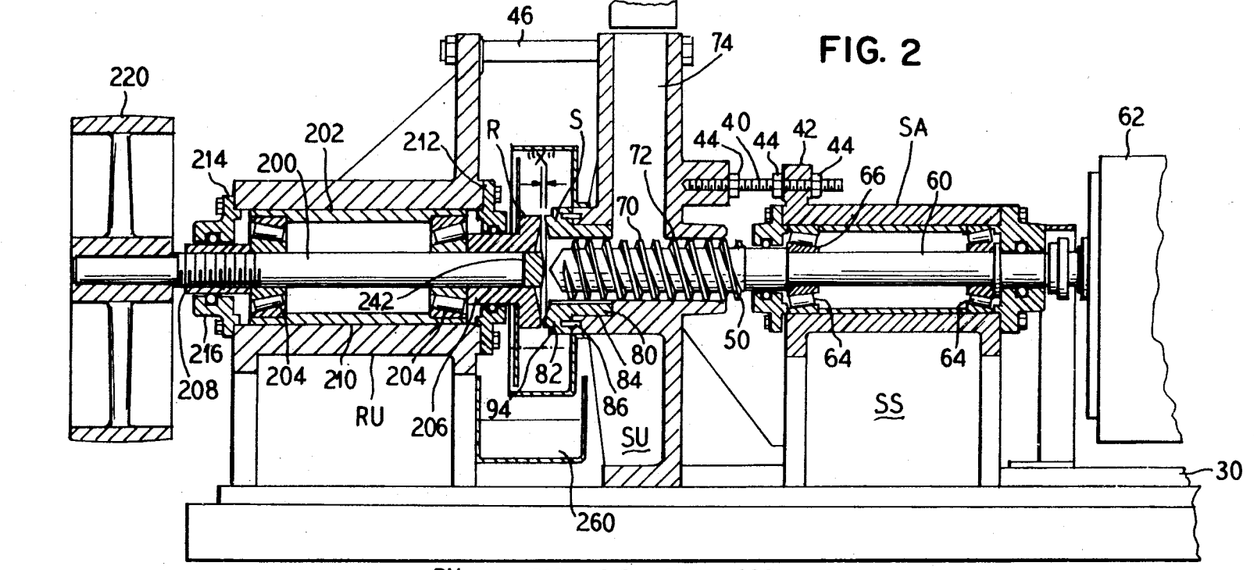
FIG. 2 is a vertical longitudinal section of the device of FIG. 1.
Figure 3:
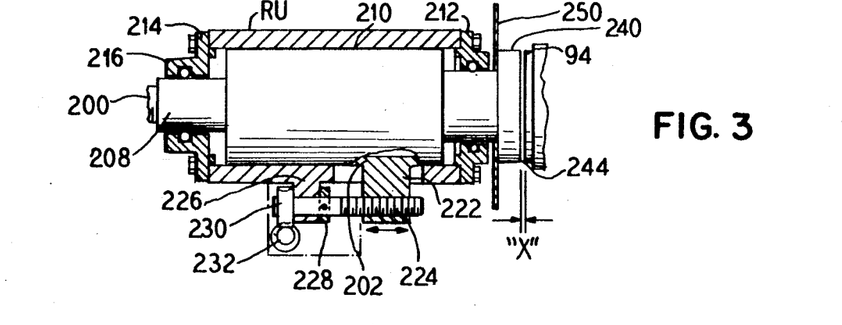
FIG. 3 is an enlarged fractional horizontal longitudinal section illustrating drive gearing for effecting axial movement of the rotor of the device of FIGS. 1 and 2.

With reference to FIGS. 1-3, the mechanical aspects of a presently preferred food extruder FE will be explained. This extruder currently is manufactured and sold under the designation 400 FMP by the present assignee, American Extrusion International, Inc.

In the embodiment illustrated in FIGS. 1-3, an extruder FE is provided with several basic components. Raw material such as corn grain is stored or fed into a hopper A. From the hopper A, the grain is transferred to a metering feeder B at which time the raw material is humidified under the control of a moisture control system C. From the metering feeder B, the raw material is conveyed via a mixer screw D (also referred to as a preblender) into an extruder unit E. In the extruder unit E, the raw material is processed as described above under the control of a programmable microprocessor controller F. The resultant cellular food product exits the extruder unit E via an outlet G. These components are described more fully below.

The illustrated hopper A is constructed such that it includes a substantially rectangular upper portion 10A and a substantially pyramidical lower portion 10B. Ground or comminuted raw grain falls under the influence of gravity through a rectangular conduit 11 towards the metering feeder B. A vibrator 12 positioned on an underside of the floor 10B assists in causing the grain to travel down the slanted surfaces of the floor the hopper A toward the rectangular conduit 11.

At the outlet of the hopper A, there is provided a moisture probe 14 used to measure the moisture content of the grain. The moisture probe 14 preferably comprises one or more dielectric sensors and forms part of the overall moisture central system C.

The illustrated moisture control system C is manufactured by Moisture Control Systems, Inc. and comprises, in addition to the robe 14, a controller 16, a water delivery system 17, and a water delivery conduit 18 through which water is added to the grain to bring the moisture content thereof up to the required level. In operation, the sensor 14 generates an analog moisture content signal which is sent to the controller 16 in which the moisture content signal is compared with another analog signal representative of a preselected desired moisture content. A differential signal resulting from the comparison is digitized and the digitized differential signal is used to control delivery of water via the conduit 18, to the metering feeder B.

The metering feeder B comprises a tapered screw that is run at variable speeds under the control of the controller F, as described more fully below. It should be noted, however, that the feed speed selected is proportional to the amount of water flow delivered by the water delivery system 17. Further, the metering feeder B controls the amount of grain transported out from the hopper A to the extruder E.

The water delivery system 17 essentially comprises a number of conduits coupled in parallel between the water delivery conduit 18 and a main water inlet. An appropriate solenoid valve is disposed in each of the parallel conduits. It can be appreciated that selective activation of the various solenoids will cause one or more of the parallel conduits to allow water to be delivered therethrough.

As will become clearer below, the water delivery system 17 preferably includes four such parallel conduits constructed either via conduit size and/or valve size to provide the following individually selectable flows:

| |
| --- |
| .15 gallons/hour |
| .30 gallons/hour |
| .60 gallons/hour |
| 1.20 gallons/hour |

As a result, flow rates from 0 gallons/hour to 2.25 gallons/hour can be selected in increments of 0.15 gallons/hour.

The present embodiment represents the first time this moisture control system manufactured by Moisture Control Systems, Inc. has been utilized in a food extruder of the type to which the invention pertains. Most notable is the provision for incrementally selectable flow rates. The assignee of the present invention enjoys exclusive rights to use of such a controller in connection with this type of food extruder.

In order to use this system C, calibration curves are installed into the system based on the grain being employed. The curve normally comprises selection of five frequencies matched to five known moisture contents. After this curve is developed and installed, the water flow rates are calibrated to match the output of the system C and the grain feed rate.

In the presently preferred embodiment, the metering feeder B is initially calibrated to feed grain to the mixer screw D at a rate of 350-375 lbs./hr. Thus, the water flow must be proportionally adjusted for this flow rate.

Commercial corn meal generally contains not more than 12% moisture by weight, but there is no guarantee as to how much less it will contain. Preferably, the moisture content of the grain feed into the mixer screw D is about 15.0 to 16.0 percent.

Following the addition of moisture, the raw food material is deposited under the influence of gravity into an inlet conduit 20 of the mixer screw or preblender D. The mixer screw D is driven by a drive or motor M2 which is digitally controlled by the controller F and comprises twin feed screws or augers that serve to evenly distribute the delivered water to the raw material in a manner such that each granule is evenly coated with surface moisture. The relatively short time between water addition and entry of the grain into the extruder unit E assures that the uniform coating of moisture on the grain is maintained.

It can be appreciated that, as a result of the foregoing, batching of the raw material preparation is not required.

The currently employed controller F, the functions of which are detailed below, is manufactured by Divelbiss Corporation and is known as the BOSS BEAR PROGRAMMABLE INTEGRATED MULTI-CONTROL SYSTEM, Model PIMS-EX-BB-XX-7. This controller is programmable in an extended compiled BASIC language known as BEAR BASIC.

For the purposes of the illustrated extruder FE, the controller F is programmed to accommodate several analog inputs, digital inputs, analog outputs, and digital outputs described more fully below. The appendix attached hereto contains proprietary source code for a presently preferred program for effecting operation of the controller F. This program is provided for illustrative purposes only and all copyrights thereto are reserved by the assignee of the present invention.

From the mixer screw D, the grain falls under the influence of gravity into a funnel shaped inlet 24 of the extruder E. Positioned above the funnel shaped inlet 24 on an underside of the mixer D is an infrared sensor IR which is directed down into the interior of the inlet 24. The sensitivity of the infrared sensor IR is set such that feeding of grain into the extruder E is halted if too much grain builds up within the inlet 24, for example, once it reaches a level just below the top of the inlet 24.

Extruder unit E is mounted on a base 30 which comprises a cabinet housing 32 containing drive motors M1, M3, and RQ. For the most part, the extruder unit E is adequately described in the prior art patents discussed above. However, for the purposes of understanding, the present invention description is provided herein of the basic components thereof.

The extruder unit E generally comprises a stator unit SU and a rotor unit RU (see FIG. 2). The stator unit SU houses a stator S while the rotor unit RU houses a rotor R.

The stator unit SU is held in spaced relation to a stator feed screw/auger unit SA by means of bolt 40 which is screw threaded into stator unit SU and passed loosely through lug 42 on the unit SA and is held in the desired position by means of nuts 44. Rotor unit RU is firmly held in spaced relation to stator unit SU by means of spaced bolts 46. Units RU and SA are firmly held in selective longitudinal positions on base 30 by means of suitable guide straps.

Thus, by removing the outer nut 44 and loosening the strap bolts which hold unit SA to base 30, this unit SA may be pulled rearwardly far enough to expose a stator feed screw or auger conveyor 50 of this unit. By removing the nuts on bolts 46 and the bolts which clamp unit RU to base 30, the rotor unit RU may also be moved away from stator unit SU in the same manner so as to make the rotor R accessible.

The stator feed screw/auger unit SA comprises a shaft 60 having a driving pulley 62 secured thereto, the shaft 60 being mounted in the unit by means of bearings 64. A sleeve 66 is screw threaded on shaft 60 with which to adjust the bearings. A stator feed screw motor M3 is appropriately coupled to the pulley 62 via a strap 67 rotatably drive the shaft 60.

Spiral projections or threads 70 of the stator feed screw 50 are adopted to fit freely within an orifice 72 in unit SU. This orifice intersects an inlet duct 74 in which the humidified grain is fed into the extruder E. Thus, when the stator feed screw 50 is appropriately turned, the stator feed screw 50, via the threads 70, will move the humidified grain from duct 74 toward the rotor R through the orifice 72 in the stator S.

A stator sleeve 80 having a flange 82 is closely fitted into an opening 84 in the stator unit SU and is held from turning therein by means of dowel pins 86.

An interior wall in sleeve 80 defines an orifice and includes spaced teeth, as described in the above patents. This opening registers with orifice 72. A face of flange 94 is provided with cut-away grooves which terminate with one edge registering with the leading edge of the teeth thus leaving a narrow annular smooth surface between the cut-away grooves and an annular groove or rabbet 93 which is cut in the face corner of flange 94.

Thus it will be seen that threads 70 extend into the orifice of the sleeve 80 and that the teeth therein will cooperate with the threads 70 to move the food material being treated and create considerable pressure and frictional heat when the movement of the material is considerably restricted as will hereinafter appear.

It can be appreciated that if it is desired to inspect the stator, all that is necessary is to loosen the straps which hold the unit SU to the frame and remove outer nut 44 and move unit SU toward the outer end of the extruder E.

Referring now to the rotor unit RU, this unit comprises a shaft 200 which is rotatably mounted in a sleeve 202 by means of bearings 204, the inner bearing resting against a sleeve 206 and being adjusted by means of a collar 208 which is screw-threaded on the shaft 200 as illustrated.

Sleeve 202 is slidably mounted in an opening 210 provided in the rotor unit RU. End members 212 and 214 act to form an oil tight chamber each being provided with a groove 216 for the reception of packing material.

A crown 220 pulley is secured to the protruding end of shaft 200. The crown pulley 220 is coupled via strap 221 to the drive motor M1 for rotatably driving the rotor R at a constant speed under the control of the controller F.

As illustrated best in FIGS. 1 and 3, the rotor is made axially moveable under the control of the controller F by means of the drive RQ and an appropriate gearing arrangement. To this end, the rotor shaft 200 is supported within the sleeve 202 by means of the two axially spaced apart collar bearings 204. The sleeve 202 itself is supported within the cylindrical orifice of the unit RU and is axially moveable therein. The sleeve 202 therefore acts as what is called a quill or rotor quill to move the shaft 200, and therefore the rotor R, between axial positions. Because the rotor R is driven by a pulley utilizing a crown arrangement, small axial deviations will not affect the rotary drive of the rotor R.

To effect axial movement of the quill, an arm 222 is provided on the quill which extends through an appropriate opening of the cylindrical housing RU. The arm 222 serves as a lug into which is threadingly engaged a bolt or shaft 224. The bolt 224 in turn is fixedly secured in a lug 226 extending from the housing RU itself by means of a collar 228 secured to the bolt 224 on one side of the lug 226 and a gear 230 secured to the bolt 224 on the other side of the lug 226. A worm gear 232 operatively associated with the drive RQ serves to engage the gear 230 thereby to effect turning of the bolt 224. It can be appreciated that appropriate driving of the worm gear 232 serves to move the quill 202, and thus the rotor R either toward or away from the stator S.

Rotor sleeve 206 is provided with a flange 240 in the center of which is secured a filler plug 242. This filler plug 242 is preferably curved on its face and is adapted to lie across the end of shaft 200 as indicated so the outer edges of the curve will be flush with the front surface 244 of the flange 240.

Additionally, the rotor R includes a disc 250 secured axially inward on flange 240, thus to direct the resulting streamlets to the outlet G. The outlet G optionally may include a reversible conveyor such as an endless belt.

By referring to FIG. 2 it will be seen that rotor R may be adjusted to a position which will bring it into contact with the apex of the stator S. Before starting the rotor R, it should be moved slightly out of contact with the stator by appropriate operation of the rotor quill drive RQ.

When the device FE is started, the hydrated material is fed into duct 74 and is moved toward the rotor R by the spiral threads 70. The rotor R is maintained in close axial position relative to the stator S. Because of the fact that the smooth surfaces of the stator S and rotor R are almost in contact, pressure and heat will immediately be generated and as the pressure and heat are increased, the material will be violently stirred thus to form a homogeneous somewhat viscous fluid which will be exuded from between surfaces thereof, as described in the prior patents.

The temperature will rise to a point which would evaporate the water or moisture at atmospheric pressure but full evaporation will be prevented by the pressure generated by spiral threads 70. As the fluid is exuded from between surfaces of the stator S and rotor R, it will form in small streams. These streams will be caused to revolve as they are exuded because one of the surfaces between which the fluid is passing (the stator S) is stationary and the other (the rotor R) is revolving. When the pressure is released, the water or moisture in the fluid will immediately flash into steam and any vapor in the liquid will expand to thereby form cellular streamlets.

It will be seen that in order to operate the device, the operator need only to see that the raw material is properly hydrated and fed into the extruder E at the right speed and that the stator and rotor surfaces are the right distance apart.

The gap that separates the rotor R and stator S is identified by the reference "X" (see particularly, FIG. 2). This gap is referred to as the rotor/stator gap and is one of the most critical parameters during the operation of the extruder FE. The size of the gap "X" controls the pressure and heat build-up created by the shear of the food product as it is extruded. As described below, this gap is varied under the control of the controller F in accordance with the program detailed in the appendix.

Further, the rotational speed of the stator feed screw 50 is proportionally related to the size of the rotor/stator gap "X". This relationship is also critical to maintaining the density of the extruded food product. In this proportional relationship, the rotational speed of the stator feed screw 50 must be increased/decreased 1 rpm for every 0.002" increase/decrease in the rotor/stator gap "X" to maintain product integrity, and vice-versa.

Figure 4:
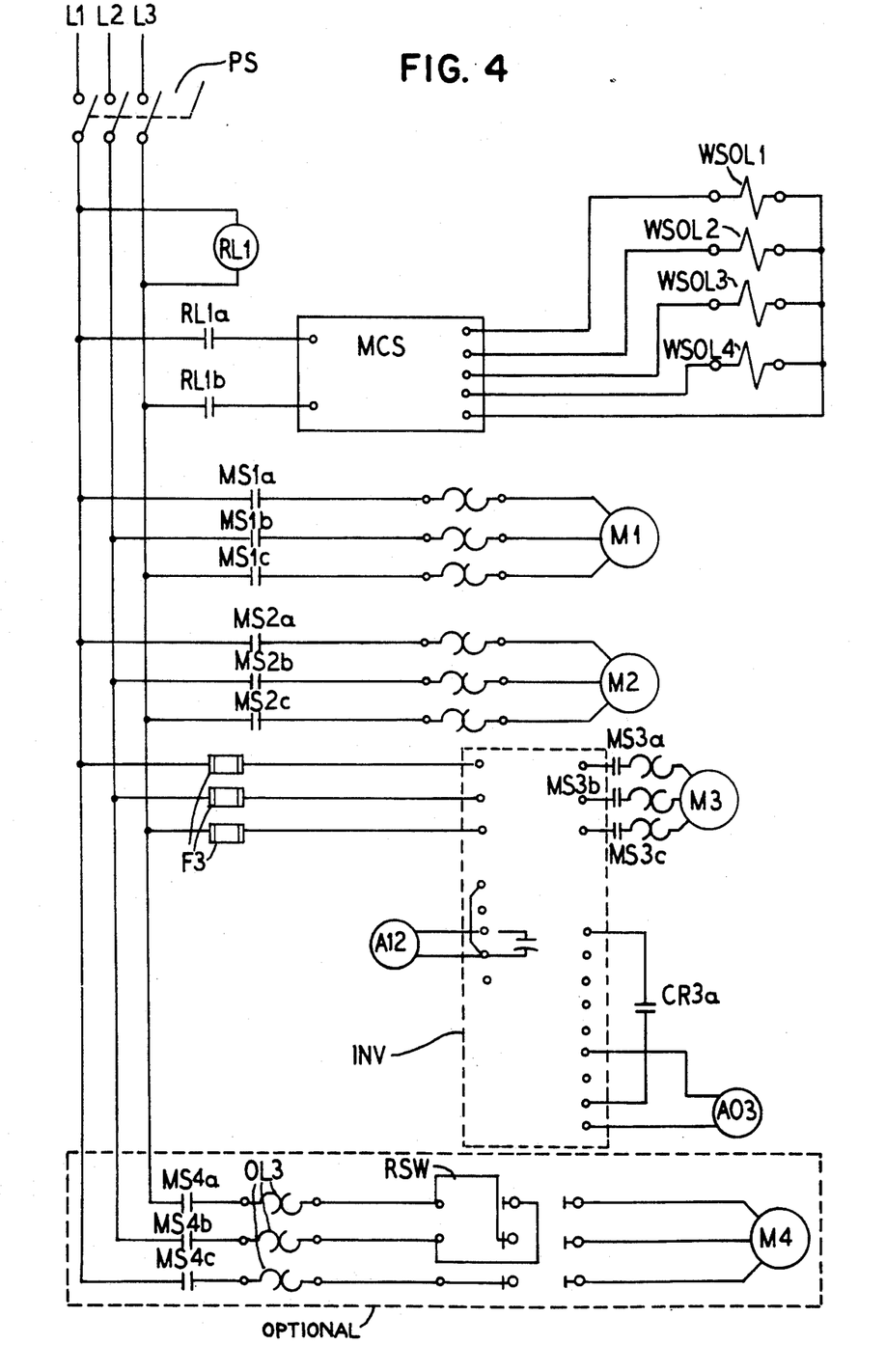
FIGS. 4–6 are wiring diagrams for the control system of the device of FIGS. 1–3.
Figure 5:
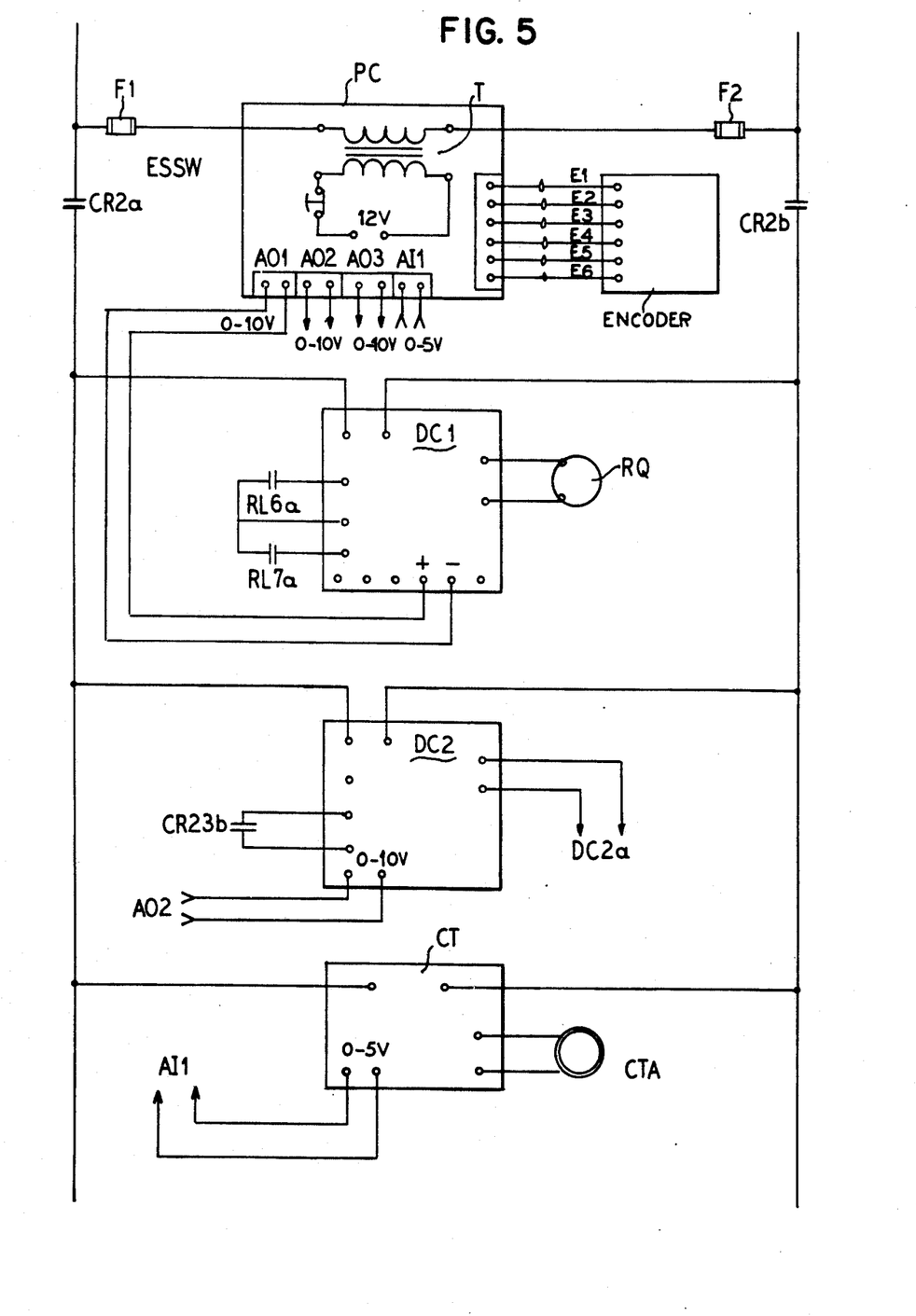
Figure 6:
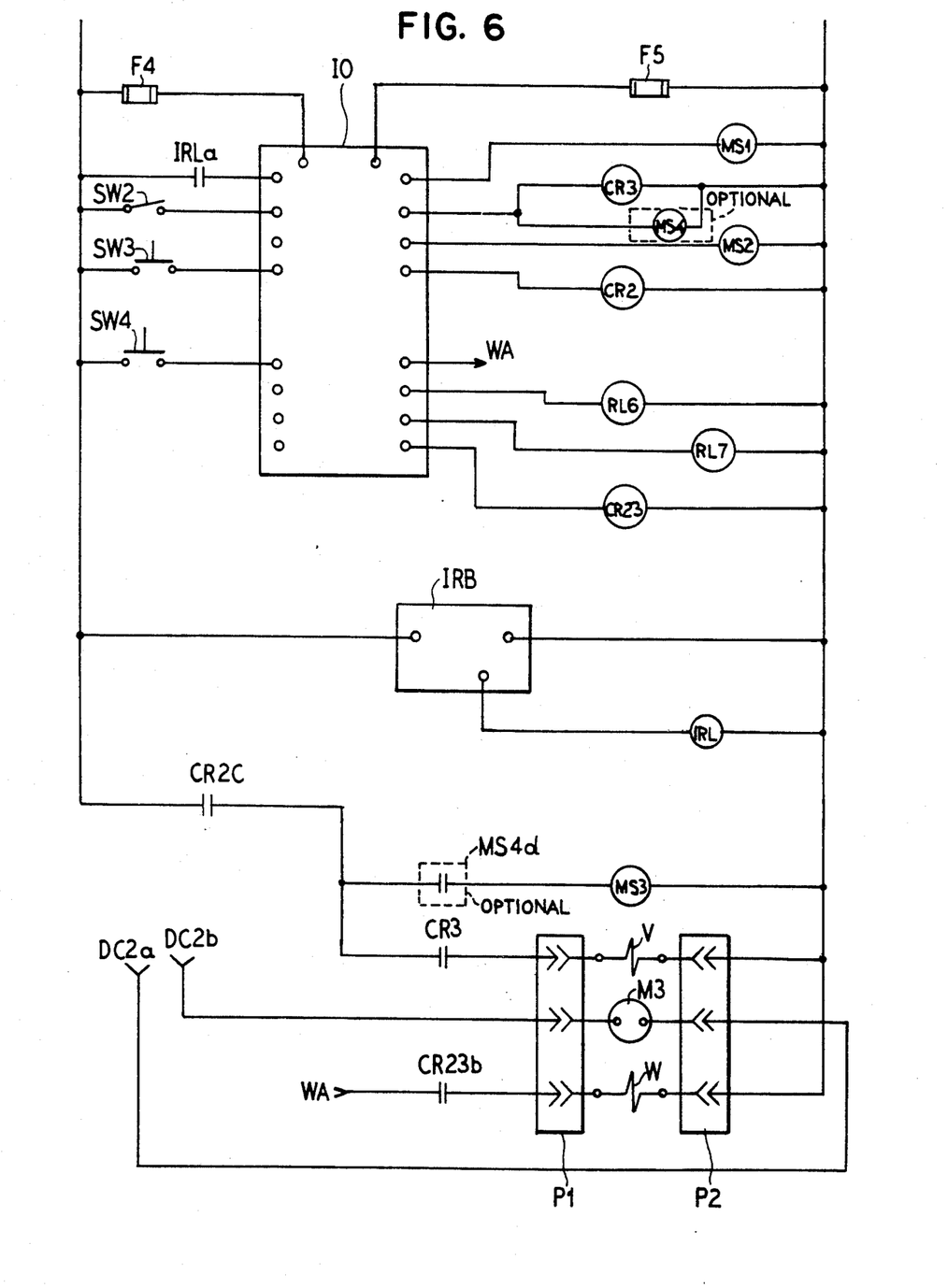

With reference to FIGS. 4–6, the control system of the extruder FE will now be described in greater detail. In FIGS. 4–6, the control system is illustrated substantially in relay logic format.

As can be seen in FIG. 4, power is provided to certain components of the extruder FE via three lines L1, L3, and L3 of a three phase, 400 volt, 50/60 Hz power line. The lines L1–L3 are appropriately switched by a disconnect switch PS disposed at an input of the power line.

Coupled across one phase comprising lines L1 and L3 is a relay RL1 used to control input of power to the moisture control system C. To this end, coupled between the moisture control system C and lines L1 and L3 are two normally open contacts RL1a and RL1b, respectively, which are closed upon energization of the relay RL1. Accordingly, when the disconnect switch PS is closed to apply power to the extruder FE, the moisture control system C is provided with power via the contacts RL1a and RL1b.

Coupled to an output of the moisture control system C are four solenoids WSOL1–WSOL4. These solenoids are associated with the valves of the various water conduits in the water delivery system 17 so that the amount of water supplied by the moisture control system to the metering feeder B can be varied, as described above. The water flow selectable via solenoid WSOL1 preferably is 1.20 gal./hr. The water flow selectable via solenoid WSOL2 preferably is 0.60 gal./hr. The water flow selectable via solenoid WSOL3 preferably is 0.30 gal./hr., and the water flow selectable via solenoid WSOL4 preferably 0.15 gal./hr. These solenoids can be actuated in any combination to provide water flows from 0–2.25 gal./hr.

Also coupled to the three phase power line is the rotor motor M1. Application of the power from the power line to the motor M1 is controlled by a relay MS1 whose normally open contacts MS1a, MS1b, and MS1c are appropriately disposed between the various power lines L1–L3 and the motor M1. Motor M1 preferably is rated at 20 hp and is operated at a constant speed.

Similarly connected is the motor M2 used to drive the preblender/mixer screw D. In this case, normally upon contacts MS2a, MS2b, and MS2c, controlled by a relay MS2, are disposed between the power lines L1–L3 and the motor M2. The mixer screw motor M2 preferably is rated at 5 HP and is operated at a constant speed. The relay MS2 is illustrated in FIG. 6.

As also illustrated in FIG. 4, the stator feed screw motor M3 is coupled to the three-phase power line via an inverter board INV which serves as a variable frequency drive therefor. The power input to the inverter board INV is appropriately protected by fuses F3.

The use of the inverter board INV permits the stator feed screw motor M3 to be operated by variable speeds, but at a constant torque. To this end, the inverter board INV accommodates the input and output of analog signals for controlling the speed of the motor M3.

As illustrated, analog signal AI2 is a 0–10 volt speed reference signal generated by the board INV and transmitted to the controller F as an input. Signal AI2 indicates the rotational speed of the motor M3. The board INV then also receives another 0–10 volt analog signal AO3 from the controller F, the signal AO3 being a speed demand signal. Starting and stopping of the motor M3 is effected by closure of normally open contact CR3a of a relay CR3, described below.

The inverter INV preferably is manufactured by Danfoss Electronics, Inc., Rockford, Ill.

Additionally illustrated are the interconnections for an optional reversible motor M4 used to drive the conveyor optionally disposed at the outlet G of the extruder E. To this end, such a motor M4 could be coupled to the power lines L1–L3 via normally open contacts MS4a, MS4b, MS4c of a relay MS4 described below. A manually activated reversing switch RSW could be placed between the contacts MS4a and MS4b and the motor M4 to effect selective reversal of the conveyor driven by the motor M4. Such a motor M4 preferably would be rated a ½ hp.

In FIGS. 5–6, it can be seen that the controller F includes a programmable controller board PC coupled between two incoming lines L5 and L6 of a single phase 200 volt power supply. The programmable controller board PC is disposed between two fuses F4 and F2 which serve to tie the inputs of a transformer T to the respective lines L5 and L6 of the input power. The 200 volt input is stepped down to 12 volts for use by the controller board PC, as indicated, and a emergency stop switch ESSW is disposed serially in an output side of the transformer T for purposes made clearer below.

As outputs, the programmable controller board PC provide 0–10 volt analog signals AO1, AO2, and AO3. The signal AO1 is used to drive the rotor quill drive RQ as described below. The signal AO2 is used to drive the metering feeder D as described below. The signal AO3 is used to drive the mixer motor M3 as described above.

As inputs, the programmable controller board PC receives a 0–5 volt analog signal AI1 from a current transmitter board CT associated with the rotor motor M1. The value of the current draw of the rotor motor M1 is used to trigger axial moving of the rotor R as well as to indicate start-up progress of the extruder E as described more fully below. Additionally, the programmable controller board PC receives signals from an encoder ENC associated with the quill 202.

With respect to the encoder ENC, six lines are used to interconnect it with the programmable controller board PC. The encoder operates in quadrature fashion to indicate the axial position of the quill 202 (and hence, the rotor R) with respect to a zero position. The quadrature arrangement is used to indicate deviation of the quill 202 in either a forward direction (toward the stator S) or reverse direction (away from the stator S).

To this end, line E1 provides 5 volts to the encoder ENC. Line E2 provides an A+ signal indicating travel in the forward direction. Line E3 provides an A− signal that is connected to ground. Line E4 provides a B+ signal which indicates the travel in the reverse direction. Line E5 provides a B− signal that is connected to ground. Line E6 is connected to ground.

The encoder ENC preferably is provided by Dynapar Corporation and is configured to provide 150 pulses per $\frac{1}{8}$ revolution of an encoder disk, one revolution occurring for each 0.008 inches travel of the quill 202. The quill is afforded a range of 0–3½ inches of travel.

It can be appreciated, when the quill 202 is caused to travel in the forward direction from the zero position, the encoder ENC will provide 8 sets of 150 pulses upon the completion of each revolution of the encoder disk. The programmable controller board PC remembers each occurrence of 150 pulses on the line E2 and calculates the amount of travel of the quill 202. Similarly, the presence of 1200 pulses on line E4 indicates an amount of travel in the reverse direction. In this manner, the controller F is able to control positioning of the rotor R to within 0.001 inches.

The remaining components illustrated in FIG. 5 comprise a portion of what is referred to as the main switchgear. The main switchgear is coupled to the power lines L5 and L6 via two normally open contacts CR2a and CR2b associated with a power interlock relay CR2 illustrated in FIG. 6. The function of this interlock is to disconnect the main switch gear upon command by the programmable controller PC via its input/output board IO, as illustrated in FIG. 6.

The control over the rotor quill drive RQ is illustrated as a DC voltage motor controller DC1. The DC voltage motor controller DC1 includes two input power lines connected to each line of the 200 volt single phase power supply. The speed of travel of the rotor quill drive RQ is determined by the analog signal AO1 provided by the programmable controller board PC. A zero volt signal dictates an off condition. A five volt signal dictates a half speed condition. A ten volt signal dictates a full speed condition.

The direction of travel of the quill 202 is determined by signals provided from the input/output board IO illustrated in FIG. 6. A normally open contact RL6a is caused to close upon the depression of a switch SW3 which serves to energize a relay RL6 associated with the contact RL6a. Conversely, depression of a reversing switch SW4 causes energization of a relay RL7 which, in turn, will cause closing of a normally open contact RL7a associated therewith. Accordingly, depression of the switch SW3 and application of an appropriate voltage by the signal AO1 will cause the rotor quill drive RQ to drive the quill 202 in the forward direction at the dictated speed. Depression of the switch SW4 will cause the rotor quill drive RQ to drive the quill 202 in the reverse direction at the dictated speed. The switches SW3 and SW4 preferably comprise keys on the keypad of the BOSS BEAR.

Also illustrated in FIG. 5 is a second DC voltage motor controller DC2 used to drive the metering feeder motor M3. To this end, the DC voltage motor controller DC2 has power inputs coupled to the 200 volt signal phase power supply. The analog signal AO2 is coupled thereto to dictate the speed at which the metering feeder is to rotate. A normally open contact CR23a associated with a relay CR23 is coupled across appropriate inputs to demand that the metering feeder D be either on or off. An output DC2a from the DC voltage motor controller DC2 is provided to a plug P illustrated in FIG. 6 through which the DC voltage motor controller DC2 is coupled to the metering feeder motor M3.

The DC voltage motor controllers DC1 and DC2 preferably are provided by Danfoss.

As briefly described above, there is associated with the rotor motor M1 a current transmitter board CT used to indicate current draw of the rotor motor M1. The current transmitter board CT is coupled to the single phase 200 volt power source and includes a current transformer CTA directly associated with the rotor motor M1. The transformer CTA provides a current step-down transformation ratio of 100 amps to 5 amps. Thus, a 100 amp current draw by the motor M1 will be transformed into a 5 amp signal which is then transmitted to the current transmitter board CT. Then, in a conventional manner, the current transmitter board CT converts the 0–5 amp signal provided by the transformer CTA into a 0–5 volt signal for use by the programmable controller board PC. The current transmitter board preferably is provided by Innotech Corporation.

The input/output board IO with the controller F is also disposed between the lines L5 and L6 of the 200 volt single phase power source and is connected thereto via two fuses FU4 and FU5. As inputs, the input/output board IO includes a normally open contact IRLa associated with a relay IRL of the infrared sensor IR. This contact IRLa is also coupled to one line of the 200 volt power source. It can be appreciated that whenever the infrared sensor IR detects that the funnel shaped inlet 24 is full, the contact IRLa will be caused to close to indicate same. The status of the contact IRLa is then used by the controller F to determine whether to turn the metering feeder D on or off.

The preferred infrared sensor IR is available from Sick Optics.

Additionally, the input/output board IO includes as inputs the forward and reversing switches SW3 and SW4 which, as described above, effect forward and reversing travel of the quill 202.

Further, the input/output board IO receives as an input a hardwired shunt SW2 which serves two functions. The first function served by the shunt SW2 is to provide access to use of the controller. Without the inclusion of this hardwire shunt, an operator would not be provided with access to control over operation of the extruder FE. Further, the shunt SW2 provides a program override capability whereby manual control is afforded over functions of the controller F. For example, without the insertion of the shunt SW2, the switches SW3 and SW4 are non-operational.

As outputs, the input/output board IO is coupled to the relays MS1, CR3, CR3a, MS2, CR2, RL6, RL7, and CR23, as indicated, as well as an optimal relay MS4. It can be appreciated that when the rotor motor M1 is to be actuated, an appropriate signal is output by the input-/output board IO under the control of the programming of the controller F to effect energization of the relay MS1 to thereby effect closure of the contacts MS1a through MS1c, illustrated in FIG. 4. Similarly, the input/output board can issue a signal to energize the relay CR3 to thereby commence operation of the stator feed screw 50.

As illustrated, optionally connected in parallel to the relay CR3 is the relay MS4 which can be used to effect operation of the optional conveyor motor M4 used to drive the optional conveyor provided at the outlet G.

The input/output board IO also controls the delivery of water from a water main to the water delivery system via a valve have a main water solenoid W. To this end, an appropriate output signal of the input/output board IO is coupled to the solenoid W via the plug P. It can be appreciated that issuance of an appropriate signal WA will cause energization of the coil of the solenoid W thereby opening the associated valve while removal of the signal WA effects closure of the valve.

As illustrated, also coupled to an output of the input-/output board IO is a relay CR2 that essentially serves as an interlock relay to lock out power to the main switch gear including the DC voltage motor controllers DC1 and DC2, the current transmitter board CT, the vibrator 12, the metering feeder motor M3, and the main water solenoid W. To this end, if relay CR2 is not energized by an appropriate signal from the input/output board IO, the normally open contacts CR2a and CR2b remain open as the normally open contact CR2c discussed below.

Also disposed between the power lines L5 and L6 is an infrared sensor board IRB operatively associated with the infrared sensor IR. It can be appreciated that when the infrared sensor IR detects a full inlet conduit 24, the infrared sensor board IRb effects appropriate energization of the relay IRL which, in turn, effects appropriate closure of the normally open contact IRLa as described above. The infrared sensor board IRB preferably is provided by Sick Optics as well.

OPERATION

The extruder FE is subject to six basic sequences/-modes of operation: MAIN MENU; PRESETS; PRE-START; START; RUN; and SHUTDOWN. With reference now to the program provided in the appendix, the operation of the extruder FE in the various sequences and/or modes will be explained.

During operation, power is applied to the entire extruder FE as indicated in FIGS. 4–6. However, initially, after the controller F starts up, all inputs and outputs are shutdown while the controller F awaits in its MAIN MENU mode for instructions from an operator. Of course, various parameters have been initialized in the program.

While the controller F awaits instructions, it sits in its MAIN MENU mode and displays a main menu from which can be selected either the START mode or the ADJUST mode. In the START mode the extruder FE will be operated. In the ADJUST mode, operating parameters can be altered.

In the START MODE, the operator is presented with two choices. The operator can select the PRE-START sequence wherein the extruder is paced through a cold start or a START sequence wherein the extruder FE is operated as if it were hot.

In the PRESTART sequence, the controller F causes the rotor to automatically move to a "HOME POSITION", if not there already. When the rotor is in its "HOME POSITION," the rotor/stator gap is 0.3 to 0.7 inches wide. The HOME POSITION is the position to which the rotor returns after each segment and allows for easy access to the extrusion work area. Additionally, when the rotor R is in its HOME POSITION in the PRESTART sequence, all functions are turned on and the extruder FE is run for about 45 seconds to precondition the grain. After 45 seconds elapse, the extruder is placed into its STOP mode in which all functions are turned off and the operator is again presented with the START mode selections.

After a PRESTART sequence, or if a hot start is to be undertaken, the operator can select a START sequence in which the extruder is started-up for steady-state operation. In this sequence, the rotor R is moved between four axial positions relative to the stator S to achieve optimal product manufacture.

To this end, after the START sequence is selected, the rotor R is moved to a first position in which the rotor/stator gap "X" is about 0.020 inches and all extruder functions are turned on. After the amperage of the rotor motor M1 exceeds 23 amps, the rotor R is moved to its second position in which the rotor/stator gap "X" is 0.045 inches. After eight (8) seconds in the second position, the rotor R is moved to its third position in which the rotor/stator gap "X" is 0.030 inches. After two (2) minutes in the third position, the rotor R is moved to its fourth position in which the rotor/stator gap "X" is 0.035 inches. At that time, the extruder automatically enters into a RUN mode in which rotor motor M1 amperage, rotor position, feed screw 50 speed, feed rate, grain moisture content, and moisture parameters are displayed.

In the RUN mode, all functions described above are maintained in accordance with the selected parameters. Specifically, stator feed screw speed is increased to a preset 155 rpm to match the rotor/stator gap X of 0.035 inches. The controller F, however, is programmed to afford some alteration of parameters.

If desired, a manual ADJUST sequence can be selected and the rotor/stator gap, feed rate, stator feed screw speed, and grain moisture content can be reset. However, certain parameters will be automatically altered in tandem by the controller F. For example, for every increase/decrease of 1 rpm of the stator feed screw speed, the rotor/stator gap will be increased/decreased by 0.002 inches and vice-versa. The stator feed screw speed can be varied between 140 and 165 rpm. At a stator feed screw speed of 155 rpm, the rotor/stator gap X should be 0.035 inches.

Additionally, the water flow of the moisture control system can be increased or decreased.

If the manual ADJUST sequence is not selected, then adjustments to the stator feed screw speed, rotor/stator gap, and moisture content are made pursuant to programmed scales/ratios.

In addition to the foregoing, an optional weigh cell can be incorporated at the output G so that product density can be monitored. If desired, the weigh cell information can be fed into the controller F which then can adjust the rotor/stator gap "X" or stator feed screw speed accordingly.

When the operation of the extruder is to be terminated, the operator can select the SHUTDOWN sequence or an EMERGENCY STOP mode. In the SHUTDOWN sequence, shutdown of operations is controlled such that the moisture control system C is turned off first. The rotor R is then moved to its HOME POSITION. When the rotor R is in its HOME POSITION, the motors M1, M2, and M3 are turned off and then about 20 seconds later, all remaining functions are turned off and the controller F again enters the MAIN MENU mode.

In the EMERGENCY STOP sequence, power is immediately removed from all drives or motors and functions and operation comes to a dead stop. This is effected by depressing the emergency stop switch ESSW.

The controller F accommodates reconfirmation or resetting of a zero rotor/stator gap setting so that accuracy is maintained in the rotor/stator gap setting during operation of the extruder FE. To this end, one sequence provided during an ADJUST mode is called the ZERO ADJUST sequence. This sequence preferably is selected at a frequency of about once a week.

In the ZERO ADJUST sequence, the controller F permits manual axial forwarding and reversing of the rotor so that it can be brought into contact with the stator, i.e., a rotor/stator gap of zero. When this position is reached, the operator simply causes the controller F to remember this position as the zero position by depressing a suitable key, in this case the "ENTER" key on the BOSS BEAR controller keypad. The controller F will then use that position for calculating distances between rotor and stator.

Once the ZERO ADJUST sequence is complete, the controller returns the rotor to its HOME position (with reference to the new zero gap setting) and the MAIN MENU is redisplayed.

The controller F also affords the operator the ability to change other operating parameters of the extruder FE. To this end, a PRESETS sequence can be selected from the PRESETS mode, which, as discussed above, is selected from the MAIN MENU.

In the PRESETS sequence, the value for any of the following:

HOME POSITION
1ST ROTOR POSITION
2ND ROTOR POSITION
3RD ROTOR POSITION
4TH ROTOR POSITION
STATOR FEED SCREW SPEED
FEED TIME (Dwell time of rotor at 2nd position)
START TIME (Dwell time of rotor at 3rd position)
CURRENT TRIP (amperage of motor M1 triggering movement of rotor to 2nd position -continued FEED RATE (Metering feeder speed)
MOISTURE CONTENT can be selected and then caused to be remembered by the controller F. To this end, an operator need only select the value by selecting a designated key, enter a value (e.g., via a keypad, and then depress a key (e.g., the "ENTER" key) to cause the controller F to remember same.

It can be appreciated that with the described system, any operator can start-up the extruder FE with the assurance that start-up will be undertaken in the most efficient manner possible. To this end, the controller F will control all operating sequences; all critical rotor positioning; and all critical speeds and formulations. Further, the controller F will provide constant displays of critical information relating to operation of the machine.

While preferred embodiments have been shown, modifications and changes may become apparent to those skilled in the art which shall fall within the spirit and scope of the invention. It is intended that such modifications and changes be covered by the attached claims.

I claim:

1. A food product extruder, comprising:
   a rotor and a stator between which raw food material is extruded to form a cellular food product, said rotor being rotatable about an axis and moveable along said axis relative to said stator, said rotor and stator being aligned along said axis;
   a first motor operatively coupled to said rotor to drive said rotor in rotation;
   a second motor operatively coupled to said rotor to move said rotor along its axis either toward or away from said stator;
   a stator feed conveyor operatively positioned to convey raw food product out of said stator, said stator feed conveyor being driven by a third motor;
   a programmable controller operatively coupled to said first, second, and third motors and programmed to sequentially move said rotor between four preselected discrete axial positions relative to said stator.

2. The food product extruder of claim 1, further including a system for humidifying said raw food product material under the control of a microprocessor so that addition of liquid to the raw food material is proportional to the rate of feeding of said raw food material into said food product extruder.

3. The food product extruder of claim 2, wherein said system for humidifying raw food material includes means for providing a plurality of different liquid flows into said raw food material.

4. The food product extruder of claim 2, wherein said system for humidifying raw food material includes means for providing selectable liquid flows in increments of 0.15 gal./hr.

5. The food product extruder of claim 1, wherein said programmable controller is programmed such that an operator can manually adjust at least some operating parameters of said food product extruder during operation thereof.

6. The food product extruder of claim 1, wherein said programmable controller is programmed such that a spacing of zero inches between the rotor and stator can be remembered or stored and used as a reference for identifying distances between said rotor and said stator.

7. The food product extruder of claim 1, wherein said programmable controller is programmed such that a gap between said rotor and said stator is automatically proportionally adjusted relative to adjustment of stator feed screw speed, and vice versa.

8. A method for controlling a food extruder wherein food product is extruded in a gap between a rotor and a stator to form a cellular food product, said rotor being rotatably driven about an axis by a first motor and axially driven by a second motor, said food product being delivered to said gap through said stator via a stator feed conveyor, the method comprising in part the steps of:
   automatically positioning said rotor to a first axial position relative to said stator during start-up of said food extruder;
   automatically repositioning said rotor to a second axial position relative to said stator when said first motor consumes at least a preselected amount of energy;
   automatically repositioning said rotor to a third axial position relative to said stator after said rotor has been in said second position for a first preselected duration of time; and
   repositioning said rotor to a fourth axial position relative to said stator after said rotor has been in said third position for a second preselected duration of time, whereby optimal product formation is obtained.

9. The method of claim 8, wherein said step of automatically positioning said rotor to a first axial position relative to said stator comprises positioning said rotor 0.020 inches from said stator.

10. The method of claim 8, wherein said step of automatically repositioning said rotor to a second axial position relative to said stator when said first motor consumes at least a preselected amount of energy comprises positioning said rotor 0.045 inches from said stator.

11. The method of claim 8, wherein said step of automatically repositioning said rotor to a third axial position relative to said stator after having been in said second position for a first preselected duration of time comprises positioning said rotor 0.030 inches from said stator.

12. The method of claim 8, wherein said step of repositioning said rotor to a fourth axial position relative to said stator comprises positioning said rotor 0.035 inches from said stator.

13. The method of claim 8, wherein said preselected amount of energy comprises 23 amps.

14. The method of claim 8, wherein said first preselected duration of time comprises about 8 seconds.

15. The method of claim 8, wherein said second preselected duration of time is about two minutes.

16. The method of claim 8, further including the step of humidifying raw food product material introduced into the food extruder by selecting a liquid flow that varies in proportion to a varying feed rate of the raw food product material into said food extruder.

17. The method of claim 16, wherein said step of humidifying said raw food material comprises selecting a combination of liquid flows which, when combined, are suitable to provide the desired overall liquid flow.

18. The method of claim 17, wherein said step of humidifying said raw food material comprises selecting any combination of the following liquid flows:

| |
|---|
| 0 gals./hr. |
| .15 gals./hr. |
| .30 gals./hr. |
| .60 gals./hr. |
| 1.20 gals./hr. | to provide the desired overall liquid flow.

19. The method of claim 8, further comprising the step of adjusting a rate of rotation of said stator feed conveyor in proportion to a gap between said rotor and stator such that said rate of rotation is increased or decreased by 1 rpm for every 0.002 inch increase or decrease, respectively in said gap.

20. A system for controlling a food extruder of the type wherein cellular food product is extruded between a rotor and a stator, comprising:
   a first drive coupled to said rotor to effect rotation of said rotor;
   a second drive coupled to said rotor to effect axial movement of said rotor;
   a humidifying system positioned to humidify raw food material introduced into said food extruder;
   a programmable controller coupled to said first and second drives and said humidifying system, said controller programmed to move said rotor between preselected axial positions relative to said stator.

21. The system of claim 20, wherein said humidifying system includes a separate microprocessor for controlling selection of fluid flows into said raw food material.

22. The system of claim 21, wherein said humidifying system includes a plurality of separate fluid conduits, each conduit accommodating a different fluid flow therein.

23. The system of claim 21, wherein said humidifying system includes means for accommodating a selection of incremental fluid flows in increments of 0.15 gals./hr.

24. The system of claim 23, wherein said humidifying system includes four different selectable conduits through which liquid can flow into said raw food material, a first conduit accommodating a flow of 0.15 gals./hr., a second conduit accommodating a flow of 0.30 gals./hr., a third conduit accommodating a flow of 0.60 gals./hr., and a fourth conduit accommodating a flow of 1.20 gals./hr.

25. The system of claim 20, wherein said programmable controller is programmed to accept adjustments in operating parameters of said controller during operation of said food extruder.

26. The system of claim 20, wherein said programmable controller is programmed such that said controller can be caused to remember or store an axial position at which said rotor is spaced by an amount of zero inches from said stator.

27. The system of claim 20, wherein said programmable controller is programmed such that a rate at which food product is extruded is automatically proportionally adjusted to sizing of a gap between said rotor and stator, and vice versa.

* * * * *